United States Patent
Kwon

(10) Patent No.: US 8,541,249 B2
(45) Date of Patent: Sep. 24, 2013

(54) METHOD FOR MANUFACTURING LIGHT EMITTING DEVICE PACKAGE AND FRAME FOR MANUFACTURING LIGHT EMITTING DEVICE PACKAGE

(75) Inventor: Choong Hwan Kwon, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 39 days.

(21) Appl. No.: 13/290,693

(22) Filed: Nov. 7, 2011

(65) Prior Publication Data
US 2012/0115261 A1    May 10, 2012

(30) Foreign Application Priority Data
Nov. 8, 2010  (KR) .................. 10-2010-0110529

(51) Int. Cl.
*H01L 33/48* (2010.01)

(52) U.S. Cl.
USPC ............. 438/26; 439/112; 439/123; 439/124; 264/272.17

(58) Field of Classification Search
None
See application file for complete search history.

(56) References Cited

U.S. PATENT DOCUMENTS

| | | | |
|---|---|---|---|
| 5,828,000 A * | 10/1998 | Sano | 174/548 |
| 5,841,187 A * | 11/1998 | Sugimoto et al. | 257/666 |
| 5,994,169 A * | 11/1999 | Lamson et al. | 438/123 |
| 6,215,174 B1 * | 4/2001 | Takada et al. | 257/666 |
| 6,335,223 B1 * | 1/2002 | Takada et al. | 438/111 |
| 6,818,971 B2 * | 11/2004 | Oda et al. | 257/667 |
| 6,943,433 B2 * | 9/2005 | Kamada | 257/666 |
| 6,956,282 B1 * | 10/2005 | Alvarez et al. | 257/666 |
| 7,748,873 B2 * | 7/2010 | Kim et al. | 362/328 |
| 7,901,113 B2 * | 3/2011 | Kim et al. | 362/328 |
| 2003/0141579 A1 * | 7/2003 | Oda et al. | 257/678 |
| 2003/0168720 A1 * | 9/2003 | Kamada | 257/666 |
| 2007/0284993 A1 * | 12/2007 | Kim et al. | 313/483 |
| 2010/0220485 A1 * | 9/2010 | Kim et al. | 362/309 |
| 2010/0302745 A1 * | 12/2010 | Hsu et al. | 361/749 |
| 2012/0105836 A1 * | 5/2012 | Yoon et al. | 356/244 |
| 2012/0115261 A1 * | 5/2012 | Kwon | 438/26 |

FOREIGN PATENT DOCUMENTS

| | | |
|---|---|---|
| KR | 10-0765241 B1 | 10/2007 |
| KR | 10-2008-0045880 A | 5/2008 |

* cited by examiner

*Primary Examiner* — David E Graybill
(74) *Attorney, Agent, or Firm* — McDermott Will & Emery LLP

(57) ABSTRACT

A method for manufacturing a light emitting device package includes: preparing a base frame including an annular base part, at least a pair of lead parts extending to an inner side of the base part, and at least one support part extending to the inner side of the base part in a direction different from that of the lead parts and having a step structure formed on at least one surface of an end thereof; forming a package main body such that the package main body is combined to the step structure of the support part; separating the lead parts from the base part; disposing a light emitting device on at least one of the lead parts; and separating the package main body from the support part.

13 Claims, 5 Drawing Sheets

METHOD FOR MANUFACTURING LIGHT EMITTING DEVICE PACKAGE AND FRAME FOR MANUFACTURING LIGHT EMITTING DEVICE PACKAGE

CROSS-REFERENCE TO RELATED APPLICATIONS

This application claims the priority of Korean Patent Application No. 10-2010-0110529 filed on Nov. 8, 2010, in the Korean Intellectual Property Office, the disclosure of which is incorporated herein by reference.

BACKGROUND OF THE INVENTION

1. Field of the Invention

The present invention relates to a method for manufacturing a light emitting device package and a frame for manufacturing a light emitting device package.

2. Description of the Related Art

A light emitting diode, a type of semiconductor light emitting device, is a semiconductor device capable of generating light of various colors according to electron hole recombination in p and n type semiconductor junction parts when current is applied thereto. Compared with a light emitting device based on a filament, the semiconductor light emitting device has various advantages such as a long life span, low power consumption, excellent initial driving characteristics, high vibration resistance, and the like, so demand for the semiconductor light emitting device continues to grow. In particular, recently, a group III-nitride semiconductor capable of emitting short-wavelength blue light has come to prominence.

A light emitting device package using such a light emitting device generally includes a package main body and a lead frame combined to the package main body, and the light emitting device is disposed on the lead frame. Large scale manufacturing of an emitting device package accompanies a process of separating the lead frame thereof, which is connected to the light emitting device package at an initial stage, and in this case, the light emitting device may be cracked, or a wire of the light emitting device may be damaged due to an impact caused by the separation process.

SUMMARY OF THE INVENTION

An aspect of the present invention provides a method for manufacturing a light emitting device package capable of minimizing a phenomenon in which a lead frame and a package main body are released, and reducing an impact applied to a light emitting device, a conductive wire, or the like.

An aspect of the present invention provides a frame for manufacturing the foregoing light emitting device package.

According to an aspect of the present invention, there is provided a method for manufacturing a light emitting device package, including: preparing a base frame including an annular base part, at least a pair of lead parts extending to an inner side of the base part, and at least one support part extending to the inner side of the base part in a direction different from that of the lead parts and having a step structure formed on at least one surface of an end thereof; forming a package main body such that the package main body is combined with the step structure of the support part; separating the lead parts from the base part; disposing a light emitting device on at least one of the lead parts; and separating the package main body from the support part.

The step structure may have a configuration in which an upper area or a central area of one surface of the end of the base part is protruded as compared with other areas thereof.

The package main body may be formed to be combined with the pair of lead parts.

The package main body may be formed to fill the space between the pair of lead parts.

The package main body may have a recess structure in which a portion of the side thereof is depressed due to the step structure.

The package main body may be formed to have at least a portion of a lower surface of the lead part exposed.

A lower surface of the package main body may be coplanar with a lower surface of at least one of the pair of lead parts and the support part.

In the separating of the package main body from the support part, the step structure combined with the package main body may be removed from the package main body.

In the separating of the package main body from the support part, the support part may be cut to separate the step structure from the other remaining portions of the support part.

One side of the package main body and one side of the step structure may be coplanar.

The disposing of the light emitting device on at least one of the lead parts may be performed after the lead parts are separated from the base part.

The disposing of the light emitting device on at least one of the lead parts may be performed before the lead parts are separated from the base part.

A plurality of base parts may be provided, and the plurality of base parts may be integrally formed in columns and rows.

According to another aspect of the present invention, there is provided a frame for manufacturing a light emitting device package, including: an annular base part; at least a pair of lead parts extending to an inner side of the base part; and at least one support part extending to the inner side of the base part in a direction different from that of the lead parts, an upper surface of an end of the lead part being protruded compared with a lower surface of the end of the lead part, and having a step structure formed on at least one surface of the end thereof.

The lead parts may be configured such that an area relatively farther from an area adjacent to the base part has a larger width.

BRIEF DESCRIPTION OF THE DRAWINGS

The above and other aspects, features and other advantages of the present invention will be more clearly understood from the following detailed description taken in conjunction with the accompanying drawings, in which:

FIGS. 1 to 3 are schematic views showing a frame for manufacturing a light emitting device package according to an exemplary embodiment of the present invention, in which FIGS. 1 and 2 are perspective views and FIG. 3 is a partial sectional view.

DETAILED DESCRIPTION OF THE PREFERRED EMBODIMENT

Figure 1:
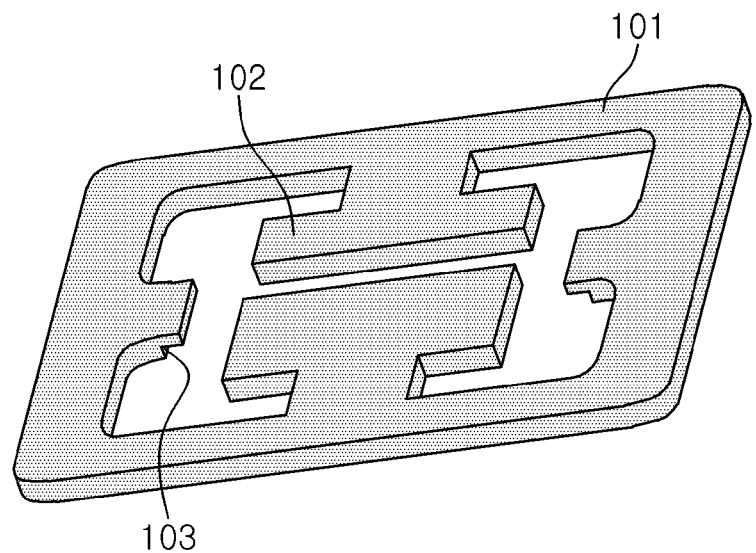

Exemplary embodiments of the present invention will now be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

Figure 2:
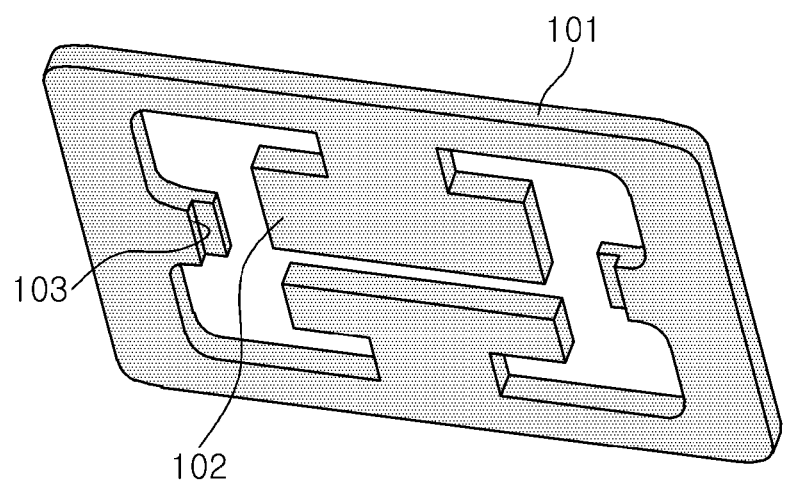
Figure 3:
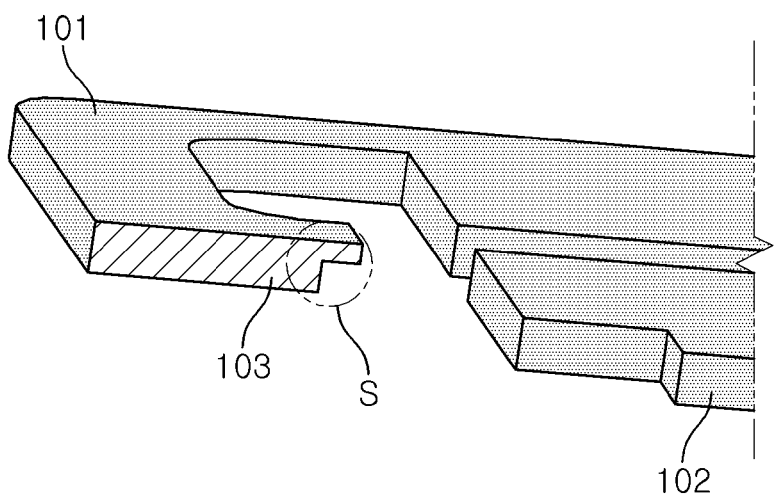

FIGS. 1 to 3 are schematic views showing a frame for manufacturing a light emitting device package according to an exemplary embodiment of the present invention, in which FIGS. 1 and 2 are perspective views and FIG. 3 is a partial sectional view. With reference to FIGS. 1 to 3, a frame (or a base frame) for manufacturing a light emitting device package according to an exemplary embodiment includes a base part 101, a lead part 102, and a support part 103, which may be integrally formed. Preferably, the frame may be made of a material having excellent electrical conductivity and light reflectivity. For example, the frame may be made of a metal such as Ag, Al, Cu, Ni, Au, Cr, Ti, or an alloy thereof.

The base part 101, having an annular shape, serves to support a light emitting device package in a follow-up process. The annular shape may be any structure so long as the interior thereof is empty in a penetrative manner in one direction, regardless of the shape thereof. For example, in FIG. 1, the base part 101 has a shape similar to a rectangular shape when viewed from above, but it may have a shape similar to a circular shape, an oval shape, or any other polygonal shape, according to embodiments. A pair of lead parts 102 are formed to extend to the inner side of the base part 101. The lead parts 102 correspond to a lead frame in a final light emitting device package. In this case, as shown in FIG. 1, the lead parts 102 may be configured such that an area relatively farther from an area adjacent to the base part 101 has a larger width, and the area with the narrow width may be provided as a cutting area for separating unit devices while the area with the large width may be provided as a mounting area of a light emitting device. Meanwhile, in the present exemplary embodiment, the pair of lead parts 102 are provided, but a larger number of lead parts 102 may be provided as necessary.

The support part 103 is formed to extend to the inner side of the base part 101 in a direction different from the lead parts 102. The support part 103 serves to support a package main body in the foregoing process of separating the unit devices. Thus, support part 103 is coupled with the package main body through a follow-up process such as molding. In the present exemplary embodiment, a step structure (S) is formed on an end of the support part 103 to increase its bonding force (or binding force) with the package main body. As shown in FIG. 3, the step structure (S) may be formed such that an upper area of one surface of the end of the support part 103 is protruded compared with other area, and according to circumstances, a central area, rather than the upper area, may be protruded. When the protruded area is formed at a lower portion of the end of the support part 103, the step structure cannot be combined with the package main body in the overall area; so preferably, the protruded area is formed at the upper area or the central area of the end of the support part 103. Because the bonding force between the support part 103 and the package main body can be increased by virtue of the step structure (S), a phenomenon in which the package main body is released from the lead part during a process can be reduced.

Figure 4:
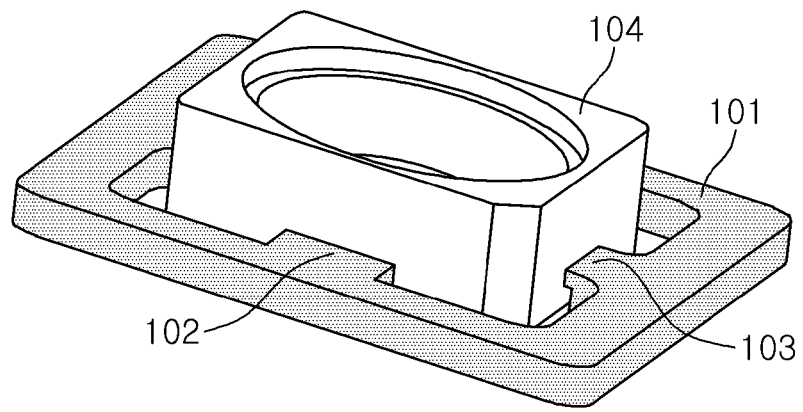
FIGS. 4 to 10 are a perspective view or a partial sectional view for explaining a method for manufacturing a light emitting device package according to an exemplary embodiment.
Figure 5:
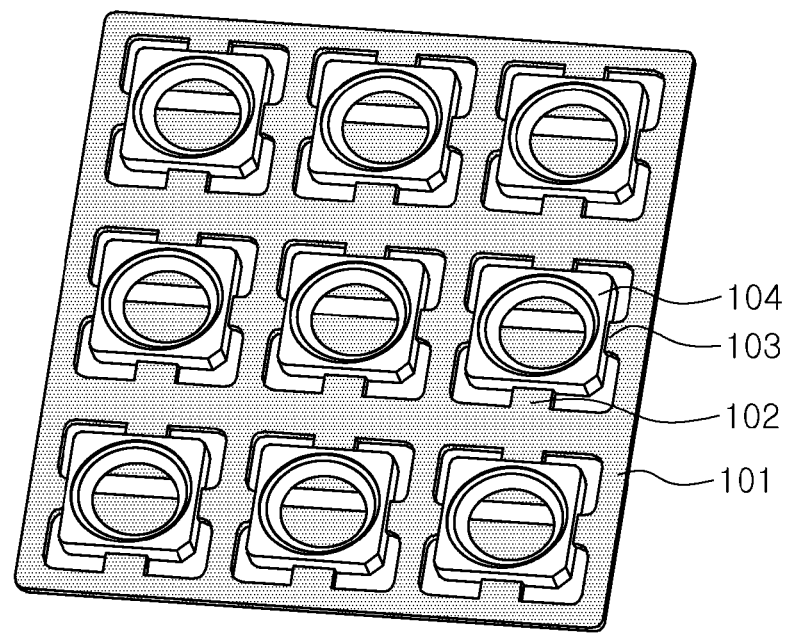
Figure 6:
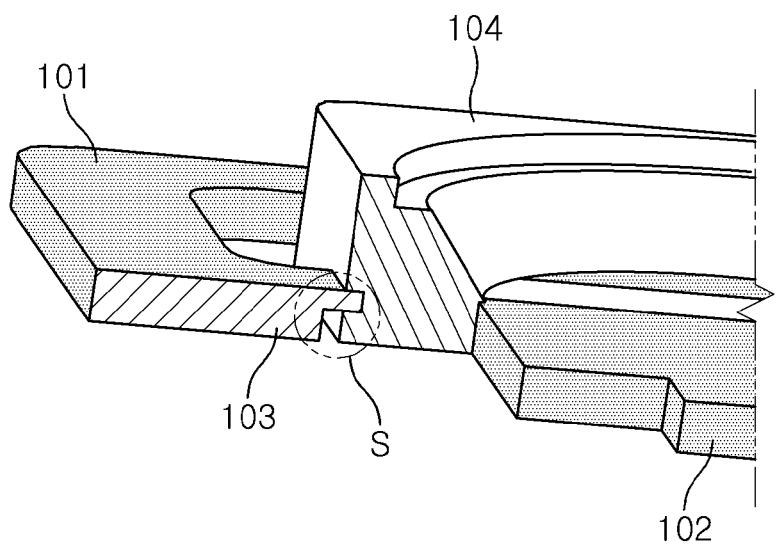

After the base frame having the foregoing structure is prepared, a light emitting device package as illustrated in FIGS. 4 to 10 may be manufactured. First, as shown in FIGS. 4 to 6, the package main body 104 is formed such that it can be combined with the step structure ('S) and the lead part 102. In this case, the package main body 104 may be formed to fill even the space between the pair of lead parts 102. The package main body 104 may be formed through a method of molding a silicon resin, an epoxy resin, or the like, and light reflective particles may be dispersed in the interior of the resin to upwardly guide light emitted from the light emitting device. The package main body 104 may not be necessarily made of a resin; it may be made of a material such as a ceramic, or the like. As described above, the package main body 104 and the support 103 may be maintained in a firm bonding state by virtue of the step structure (S).

Figure 7:
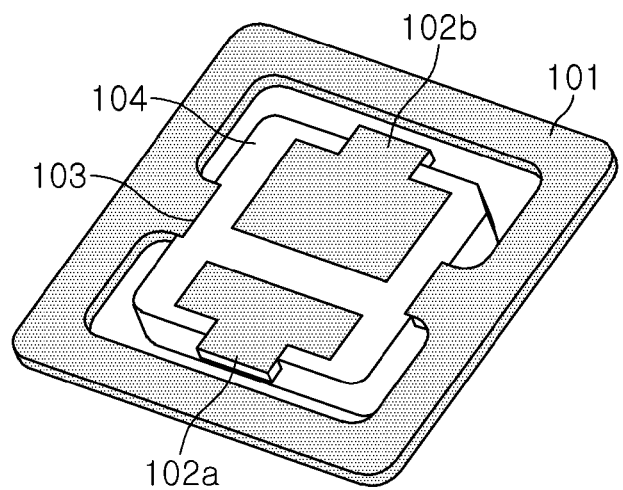

In the present exemplary embodiment, the package main body 104 is formed to have at least a portion of an upper surface of the lead part 102 and at least a portion of a lower surface of the lead part 102 exposed. The exposing of the upper surface of the lead part 102 is undertaken to mount the light emitting device on the lead part 102, and the exposing of the lower surface of the lead part 102 is undertaken to effectively release heat through the lead part 102 having a relatively high level of heat conductivity. In this case, as shown in FIG. 7, a lower surface of the package main body 104 may be formed to be coplanar with the lower surface of the lead part 102, and also may be formed to be coplanar with a lower surface of the support part 103. Meanwhile, FIG. 4 shows the manufacturing of an individual package, but as shown in FIG. 5, the base parts 101 may be integrally formed in columns and rows, and accordingly, a plurality of light emitting device packages can be effectively manufactured.

As shown in FIG. 7, the lead part 102 is separated from the base part 101, and accordingly, a pair of lead frames 102a and 102b can be obtained. Accordingly, the package main body 104 is supported only by the support part 103. In this case, the reliability of the process can be improved by the process of separating the lead part 102 from the base part 101 and the step structure of the support part 103. FIG. 7 is a bottom perspective view of the light emitting device package according to the present exemplary embodiment. The pair of lead frames 102a and 102b obtained in the present process may serve to perform a heat releasing function, while providing a mounting area of the light emitting device, and also serve as electrodes for applying an electrical signal to the light emitting device.

Figure 8:
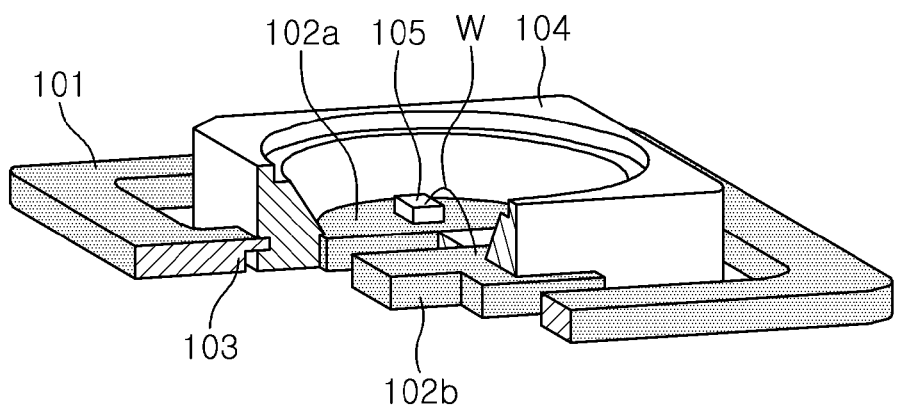

Next, as shown in FIG. 8, a light emitting device 105 is disposed on one of the pair of lead frames 102a and 102b, e.g., on the first lead frame 102a in the present exemplary embodiment. The light emitting device 105 may be any device so long as it can emit light when an electrical signal is applied thereto. For example, the light emitting device 105 may be a light emitting diode. A conductive wire (W) may be used to electrically connect the light emitting device 105 and the lead frame 102b. Alternatively, conductive wires may be connected to both the first and second lead frames 102a and 102b, or the light emitting device 105 and the lead frames 102a and 102b may be connected without using a conductive wire (e.g., in a flip chip structure). Meanwhile, in the present exemplary embodiment, the lead part 102 is separated from the base part 101 and then the light emitting device 105 is disposed, but the order thereof may be reversed as necessary. Namely, before the lead part 102 is separated from the base part 101, the light emitting device 105 may be disposed on the lead part 102 and the lead part 102 may be then separated, and in this case, the effect of the step structure (S) of the support part 103 can work even to the light emitting device 105.

Figure 9:
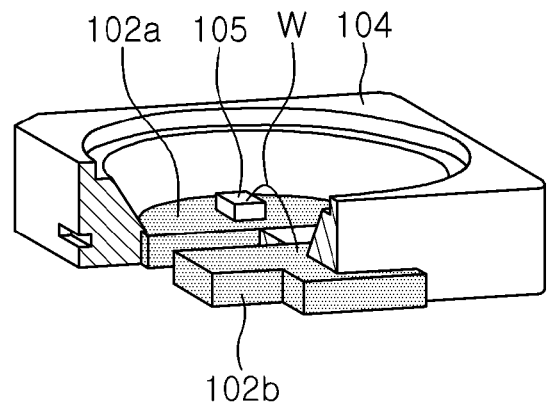
Figure 10:
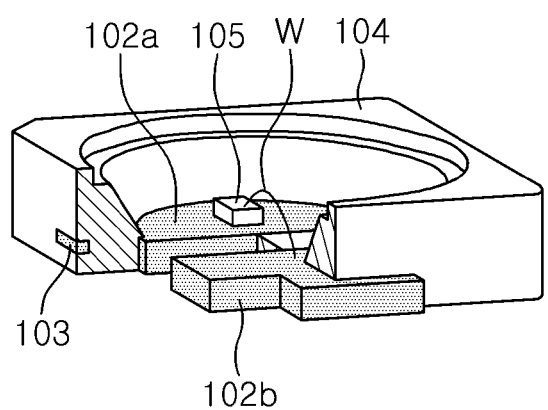

Thereafter, as shown in FIG. 9, the support part 103 is separated from the package main body 104, thus obtaining an individual light emitting device package. In removing the support part 103, a force may be applied vertically to the base part 101 to extract (or remove) the support part 103, specifically, the step structure of the end of the support part 103, from the package main body 104. In this case, as shown in FIG. 9, the package main body 104 has a recess structure in which a portion of the side is depressed (or subsides) due to the step structure. Alternatively, as shown in FIG. 10, the step structure may remain in the package main body 104. Namely, instead of applying stress to the base part 101, the support part 103 may be cut to separate the step structure from the other portions of the support part 103, and in this case, one side of the package main body 104 and one side of the step structure may be coplanar. Meanwhile, although not shown, a transparent resin part may be formed to cover the light emitting device 105 by filling the interior of the package main body 104 after the current process or in any previous step (but after formation of the package main body), and in addition, a wavelength conversion part for converting light emitted from the light emitting device 105 into light of a different wavelength may be formed in the interior of the transparent resin or on the transparent resin.

As set forth above, according to exemplary embodiments of the invention, in manufacturing a light emitting device package, a phenomenon in which a package main body is released from a lead frame can be minimized, and an impact applied to a light emitting device, a conductive wire, or the like, can be reduced.

Also, a frame used for a method for manufacturing a light emitting device package can be obtained.

While the present invention has been shown and described in connection with the exemplary embodiments, it will be apparent to those skilled in the art that modifications and variations can be made thereto without departing from the spirit and scope of the invention as defined by the appended claims.

What is claimed is:

1. A method for manufacturing a light emitting device package, the method comprising:
    preparing a base frame including an annular base part, at least a pair of lead parts extending to an inner side of the base part, and at least one support part extending to the inner side of the base part in a direction different from that of the lead parts and having a step structure formed on at least one surface of an end thereof;
    forming a package main body such that the package main body is combined with the step structure of the support part;
    separating the lead parts from the base part;
    disposing a light emitting device on at least one of the lead parts; and
    separating the package main body from the support part.

2. The method of claim 1, wherein the step structure has a configuration in which an upper area or a central area of one surface of the end of the base part is protruded as compared with other areas thereof.

3. The method of claim 1, wherein the package main body is formed to be combined with the pair of lead parts.

4. The method of claim 3, wherein the package main body is formed to fill the space between the pair of lead parts.

5. The method of claim 1, wherein the package main body has a recess structure in which a portion of the side thereof is depressed due to the step structure.

6. The method of claim 1, wherein the package main body is formed to have at least a portion of a lower surface of the lead part exposed.

7. The method of claim 6, wherein a lower surface of the package main body is coplanar with a lower surface of at least one of the pair of lead parts and the support part.

8. The method of claim 1, wherein, in the separating of the package main body from the support part, the step structure combined with the package main body is removed from the package main body.

9. The method of claim 1, wherein, in the separating of the package main body from the support part, the support part is cut to separate the step structure from the other remaining portions of the support part.

10. The method of claim 9, wherein one side of the package main body and one side of the step structure are coplanar.

11. The method of claim 1, wherein the disposing of the light emitting device on at least one of the lead parts is performed after the lead parts are separated from the base part.

12. The method of claim 1, wherein the disposing of the light emitting device on at least one of the lead parts is performed before the lead parts are separated from the base part.

13. The method of claim 1, wherein a plurality of base parts are provided, and the plurality of base parts are integrally formed in columns and rows.

* * * * *